United States Patent
Mothe et al.

(10) Patent No.: US 10,935,437 B2
(45) Date of Patent: Mar. 2, 2021

(54) COAXIAL HIGH TEMPERATURE THERMOCOUPLE BACKGROUND

(71) Applicant: Rosemount Aerospace Inc., Burnsville, MN (US)

(72) Inventors: Venkata Anil Kumar Mothe, Karnataka (IN); Richard William Phillips, Eagan, MN (US)

(73) Assignee: ROSEMOUNT AEROSPACE INC, Burnsville, MN (US)

(*) Notice: Subject to any disclaimer, the term of this patent is extended or adjusted under 35 U.S.C. 154(b) by 284 days.

(21) Appl. No.: 15/984,558

(22) Filed: May 21, 2018

(65) Prior Publication Data

US 2019/0293496 A1 Sep. 26, 2019

(30) Foreign Application Priority Data

Mar. 26, 2018 (IN) .............................. 201811011117

(51) Int. Cl.
*G01K 7/00* (2006.01)
*G01K 7/06* (2006.01)
(Continued)

(52) U.S. Cl.
CPC ............... *G01K 7/06* (2013.01); *G01K 7/023* (2013.01); *G01K 13/02* (2013.01); *H01L 35/10* (2013.01);
(Continued)

(58) Field of Classification Search
CPC ...................................................... G01K 7/06
See application file for complete search history.

(56) References Cited

U.S. PATENT DOCUMENTS 2,307,626 A 1/1943 Kelly
2,431,953 A 12/1947 McAninch
(Continued)

FOREIGN PATENT DOCUMENTS

EP 0989393 A2 3/2000
GB 832605 A 4/1960

OTHER PUBLICATIONS

Partial European Search Report for Application No. 19164872.4, dated Aug. 27, 2019, 47 pages.
(Continued)

*Primary Examiner* — Lisa M Caputo
*Assistant Examiner* — Nasir U. Ahmed
(74) *Attorney, Agent, or Firm* — Cantor Colburn LLP (57) ABSTRACT

A thermocouple assembly for use in a high-temperature gas path that includes a thermocouple. The thermocouple includes a first conductor and a second conductor, the first and second conductors formed of different materials and coupled to one another by junction, a metal sheath surrounding the first and second conductors wherein the metal sheath is substantially coaxial with the both the first conductor and the second conductor. The assembly also includes: a first termination electrically coupled to the first conductor; a second termination electrically coupled to the second conductor; a first connector configured to couple to the first termination; a second connector configured to couple to the second termination; and a housing configured to cover the first and second terminations and the first and second connectors.

18 Claims, 6 Drawing Sheets

(51) Int. Cl.
*H01L 35/10* (2006.01)
*H01L 35/30* (2006.01)
*G01K 7/02* (2021.01)
*H01L 35/32* (2006.01)
*G01K 13/02* (2021.01)
*H01L 35/14* (2006.01)

(52) U.S. Cl.
CPC .............. *H01L 35/30* (2013.01); *H01L 35/32* (2013.01); *G01K 2013/024* (2013.01); *H01L 35/14* (2013.01)

(56) References Cited

U.S. PATENT DOCUMENTS

| | | | |
|---|---|---|---|
| 3,199,967 A | 8/1965 | Pixley | |
| 4,808,794 A * | 2/1989 | Foreman | H05B 3/82 |
| | | | 219/437 |
| 5,246,293 A | 9/1993 | Luotsimen et al. | |
| 5,386,173 A * | 1/1995 | Kosmatka | F21S 41/17 |
| | | | 313/318.01 |
| 6,798,214 B1 | 9/2004 | Klevens | |
| 7,465,086 B1 * | 12/2008 | Foreman, Jr. | G01K 1/08 |
| | | | 136/200 |
| 2002/0061049 A1 | 5/2002 | Adachi et al. | |
| 2009/0168839 A1* | 7/2009 | Park | G01K 1/18 |
| | | | 374/165 |
| 2013/0243036 A1* | 9/2013 | Scervini | G01K 1/08 |
| | | | 374/179 |
| 2016/0072203 A1* | 3/2016 | Ii | H01R 4/48 |
| | | | 439/816 |

OTHER PUBLICATIONS

European Search Report for Application No. 19164872.4, dated Jan. 14, 2020, 11 pages.

* cited by examiner

COAXIAL HIGH TEMPERATURE THERMOCOUPLE BACKGROUND

FOREIGN PRIORITY

This application claims priority to Indian Patent Application No. 201811011117 filed Mar. 26, 2018, the entire contents of which is incorporated herein by reference.

Exemplary embodiments pertain to the art of thermocouples and, in particular, to thermocouples for high temperature applications.

A thermocouple is an electrical device consisting of two electrical conductors formed of different materials. The conductors are joined together, typically at a distal end of the conductors. In operation, a thermocouple produces a temperature-dependent voltage due to the so-called "thermoelectric effect." The voltage so produced can be interpreted in a manner such that it is used to measure temperature.

Typically, thermocouple elements used in existing designs will contain both positive and negative conductors packed inside one mineral insulated cable or sheath. The junction where the two conductors are joined in the tip of sheath is used to measure temperature.

BRIEF DESCRIPTION

Disclosed is a thermocouple assembly for use in a high-temperature gas path that includes a thermocouple. The thermocouple includes a first conductor and a second conductor, the first and second conductors formed of different materials and coupled to one another by junction, a metal sheath surrounding the first and second conductors wherein the metal sheath is substantially coaxial with the both the first conductor and the second conductor. The assembly also includes: a first termination electrically coupled to the first conductor; a second termination electrically coupled to the second conductor; a first connector configured to couple to the first termination; a second connector configured to couple to the second termination; and a housing configured to cover the first and second terminations and the first and second connectors.

In one or more prior embodiments, the assembly further includes a mounting flange, the mounting flange surrounding the first and second terminations and configured to fastened to the housing.

In one or more prior embodiments, the mounting flange is electrically insulated from the first termination by a glass seal.

In one or more prior embodiments, the thermocouple further includes insulation disposed between the first conductor and the metal sheath.

In one or more prior embodiments, the insulation is formed of MgO or $Al_2O_3$.

In one or more prior embodiments, the metal sheath is coaxial with at least one of the first and second conductors.

In one or more prior embodiments, the metal sheath is formed of one of: Inconel 600, Hastelloy X, Haynes 188 or Haynes 230.

In one or more prior embodiments, the metal sheath includes an inner layer formed of a different material than the metal sheath.

In one or more prior embodiments, the first and second terminations are coupled to the metal sheath.

In one or more prior embodiments, the first and second connectors are spring loaded joints.

In one or more prior embodiments, the housing includes an outer metal portion and an insert molded inner region within the outer metal portion.

In one or more prior embodiments, wherein the insert molded inner region is formed of a glass-mica composite material.

In one or more prior embodiments, the assembly further includes wave springs disposed in the insert molded inner region to hold the connections on to the terminations.

In one or more prior embodiments, the assembly further includes a first wire encircling the first connection and a second wire encircling the second connection.

In one or more prior embodiments, the assembly further includes an insulator disposed between the first connector and the mounting flange.

In one or more prior embodiments, the assembly further includes one or more bolts coupling the housing to the mounting flange.

In one or more prior embodiments, the first and second connectors are ring connectors.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1A:
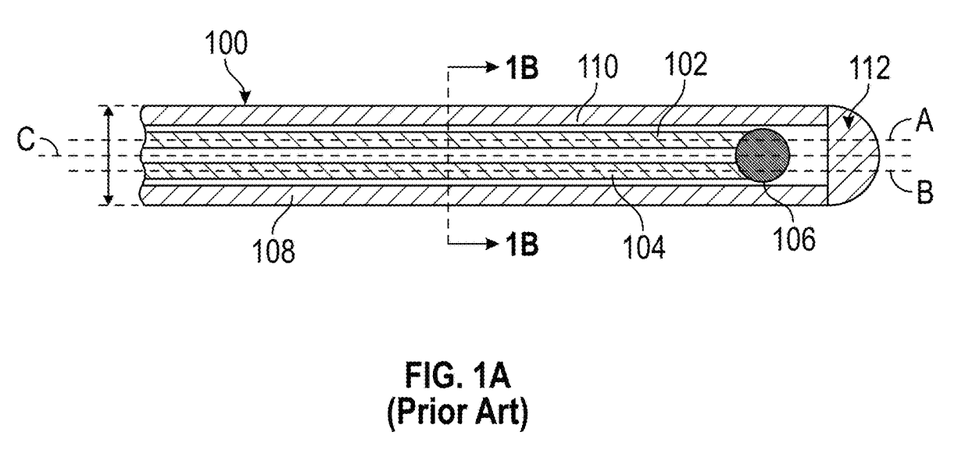
FIG. 1A is a cross-sectional side view of a prior art thermocouple.
Figure 1B:
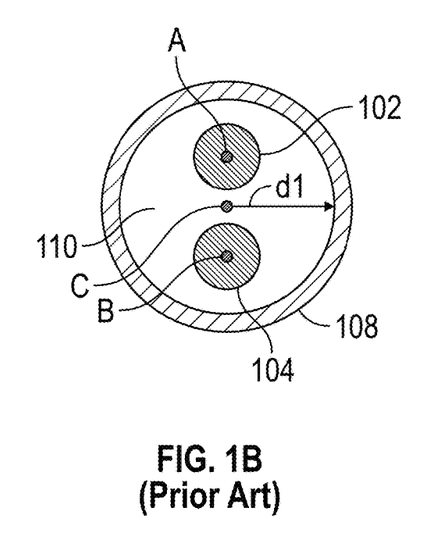
FIG. 1B is a cross-section of FIG. 1A.

FIGS. 1A and 1B show an example of a prior art thermocouple 100. The thermocouple 100 includes two conductors 102, 104. One of these can be considered a positive conductor and the other a negative conductor. In the prior art and in embodiments of disclosed herein, the conductors can be formed of different materials such as Nickel-Chromium Alloy and Nickel-Aluminum Alloy. In some embodiments the positive conductor can be referred to as KP and the negative conductor KN. The conductor 102, 104 connected to one another by a junction 106 that is used for measuring the temperature. The size of the junction is selected to accommodate the two conductors 102, 104.

The two conductors, 102, 104 and the junction 106 are surrounded by a metal sheath 108. Mineral insulation 110 disposed between the conductors 102, 104 and the between the conductors 102, 104 and the metal sheath 108. Such a configuration can be referred to as a mineral-insulated, metal-sheathed (MIMS) construction and very common and covered by industrial standards such as ASTM E608 and IEC 61515. In operation, at least a tip 112 of the thermocouple 100 (and most likely, a portion that at least includes the junction 106) is exposed to a hot gas, for example.

As illustrated in FIGS. 1A and 1B, each of the two conductors 102, 104 have longitudinal axes A and B, respectively, which are parallel or generally parallel to one another. The metal sheath 108 also has a longitudinal axis C. This axis is parallel to both axes A and B. The metal sheath 108 has diameter d1.

In contrast to the prior art, embodiments disclosed herein have coaxial or substantially coaxial configuration of the conductors relative to the outer metal sheath. The term "substantially coaxial" as the term is used herein refer to the situation where the axis of one element not perfectly coaxial with another but is within an outer periphery of the other element.

Figure 2A:
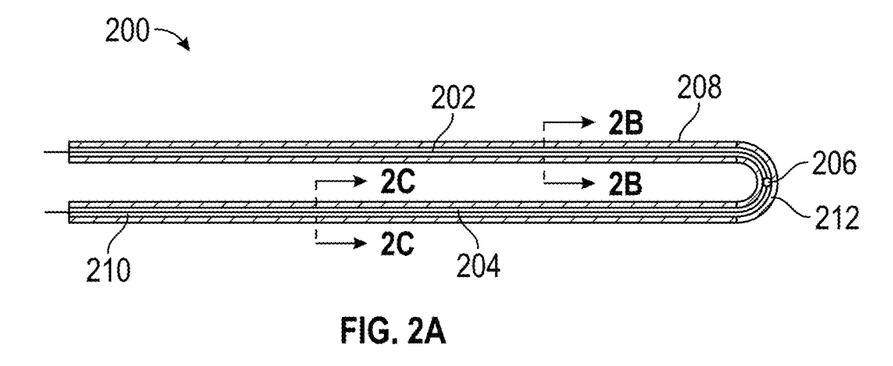
FIG. 2A is a cross-sectional side view of a thermocouple according to one embodiment.
Figure 2B:
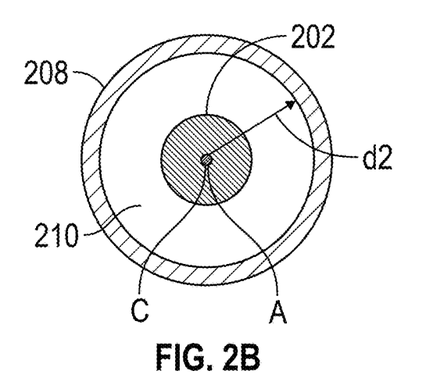
FIG. 2B is a cross-section of FIG. 2A according to one embodiment.

FIGS. 2A and 2B show an example of thermocouple 200 according to one embodiment. The thermocouple 200 includes two conductors 202, 204. One of these can be considered a positive conductor and the other a negative conductor. In the prior art and in embodiments of disclosed herein, the conductors can be formed of different materials such as Nickel-Chromium Alloy and Nickel-Aluminum Alloy. In some instances the positive conductor can be referred to as KP and the negative conductor KN. The conductor 202, 204 connected to one another by a junction 206 that is used for measuring the temperature. The size of the junction is selected to accommodate the two conductors 202, 204.

The two conductors, 202, 204 and the junction 206 are surrounded by a metal sheath 208. Mineral insulation 210 disposed between the conductors 202, 204 and the metal sheath 208. In operation, at least a tip 212 of the thermocouple 100 (and most likely, a portion that at least includes the junction 106) is exposed to a hot gas, for example.

Figure 2C:
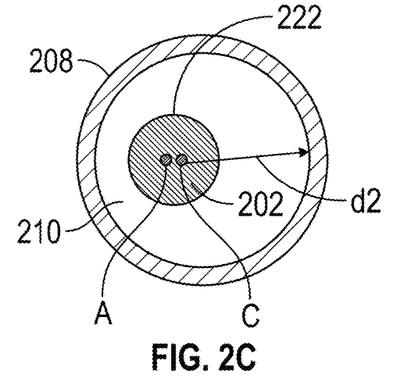
FIG. 2C is a cross-section of FIG. 2A according to one embodiment taken along one conductor.

FIGS. 2B and 2C show a coaxial configuration and a substantially coaxial configuration of the thermocouple 200 of FIG. 2A taken along line B-B. In FIG. 2B the first conductor 202 includes an axis A and the metal sheath includes an axis C that is coaxial with axis A and, thus, are represented as the same element. The metal sheath 208 has diameter d2.

Figure 2D:
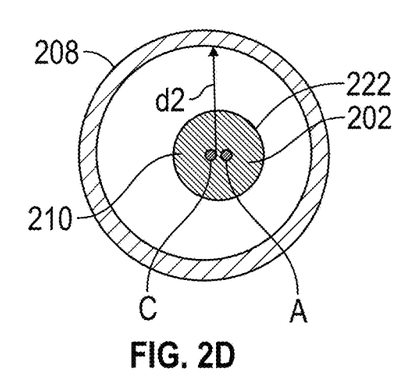
FIG. 2D is a cross-section of FIG. 2A according to one embodiment taken along a different conductor that conductor.

In FIG. 2C the first conductor 202 includes an axis A and the metal sheath includes an axis C that is slightly offset from axis A but with the outer perimeter 220 of the first conductor 202. Such a configuration, as described above, shall be referred to as being "substantially coaxial." In particular, the metal sheath 208 is substantially coaxial with the first conductor 202 because axis C is within the outer perimeter 220 of the first conductor 202. Similarly, and a shown in FIG. 2D, which is a cross section taken along line C-C in FIG. 2A, the metal sheath 208 is substantially coaxial with the second conductor 203 because axis C is within the outer perimeter 222 of the second conductor 204.

The insulation 210 can be formed of MgO in one embodiment. In another it can be formed of a Al$_2$O$_3$ fibrous sleeving. In another embodiment insulation is a Al$_2$O$_3$ or MgO ceramic coating applied by plasma spray.

The outer sheath 208 can be formed as a single sheath formed over the conductors 202, 204, junction 206, and the insulation 210. The sheath can be swaged over the insulation in one embodiment. Regardless of how applied, the metal sheath 208 can be formed of Inconel 600, Hastelloy X, Haynes 188 or Haynes 230 to name but a few. While the outer sheath has been shown heretofore as a single layer it shall be understood that it could be formed of two layers. For example the inner layer could be optimized for compatibility with the conductors and the outer layer optimized to withstand high heat. For example, the inner layer could be KP alloy while the outer layer is Haynes 230. OF course the inner layer could be metal foil such as Ti. In one embodiment, the inner layer is formed of a different material than the sheath 208.

The thermocouple 200 could be formed by first joining the conductors 202, 204 with the junction 206, and then applying the insulation and then the metal sheath. The assembly could then be bent into a u-shape with the junction being at or near a distal end of the assembly. The above described thermocouple may allow for easier construction with no welding.

In addition, the substantially coaxial type element design of thermocouple 200 can have faster response times than the prior art. In particular, the time constant/time response is dependent on the convective heat transfer coefficient. The time constant/response will improve if the heat transfer coefficient and surface area exposed to the gas being measured is improved. The time constant is approximated by the lumped heat capacity model. In such a model, the time constant τ is defined as follows:

$$\tau = \frac{\rho V C p}{hA}$$

where ρ is the density of the sensing element, V is volume of the sensing element, Cp is the specific heat of the sensing element, h is the fluid heat transfer coefficient and A is the area of the sensing element.

In coaxial or substantially coaxial arrangements described above, the surface area of exposure to fluid increases for given volume which helps in improving the time response. The coaxial element allows for minimizing sheath diameter (reduce mass "ρV" and improve response) without compromising dielectric strength. The configuration promotes a preferred cross flow condition (increase effective area "A") regardless of probe orientation to flow.

Figure 3A:
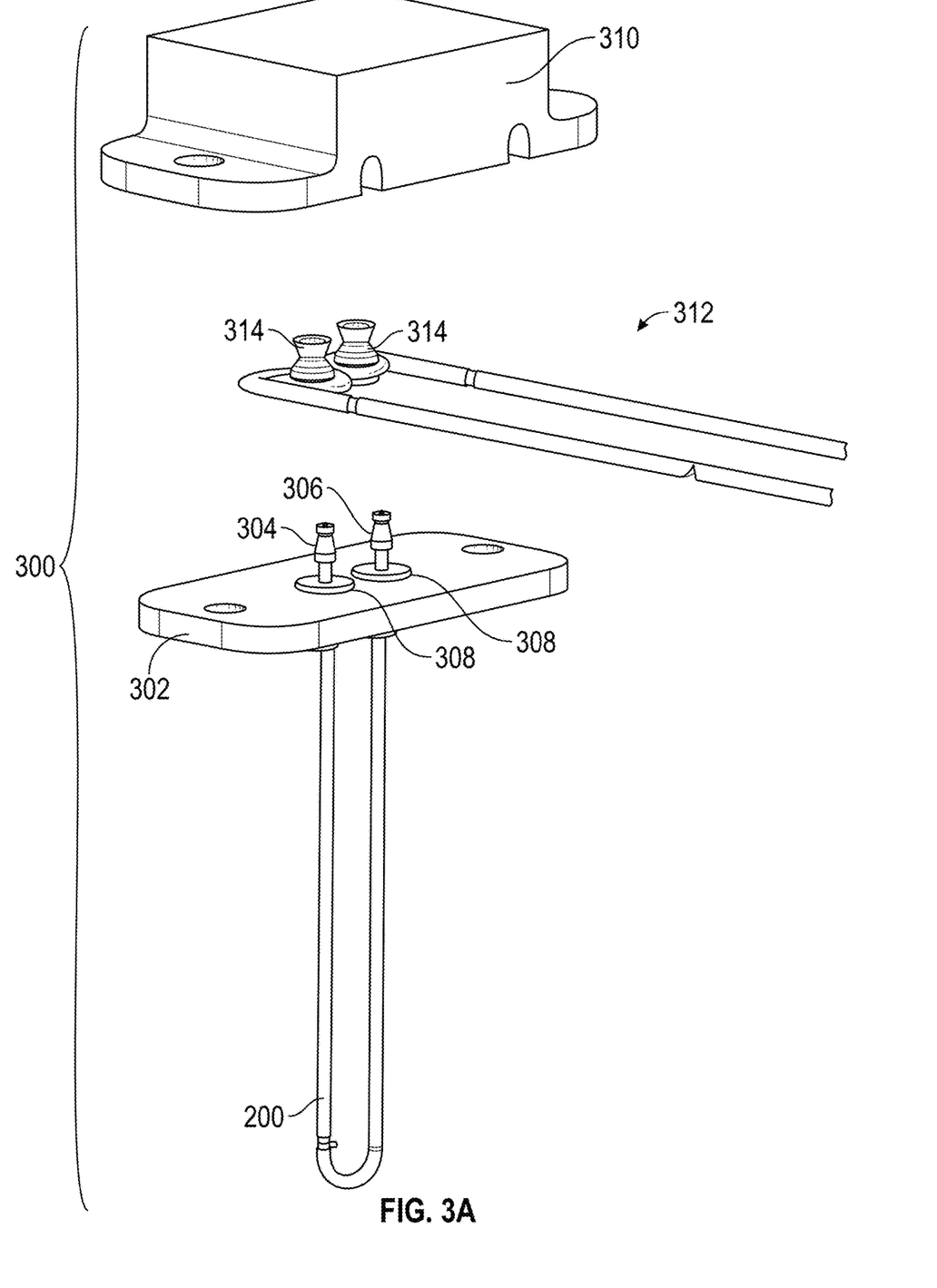
FIG. 3A is an exploded view of a thermocouple assembly according to one embodiment that includes a thermocouple, connectors and a housing that connects to a mounting flange of that covers the connectors.

In one embodiment, the sheath diameter can be reduced by 50% which will reduce the response time proportionally. For example, d2 (FIG. 2B) can be 50% smaller that d1 (FIG. 1B). Further, such a configuration will allow for increased sheath thickness that can improve high temperature life time of the thermocouple 200. FIG. 3A shows an exploded view of example 300 assembly that includes a thermocouple 200 connected to a mounting flange 302. The conductors (202, 204, not shown) are coupled to terminations 304, 306. In one embodiment, the terminations 304, 306 are connected directly to the sheath 208 of the thermocouple 200. Conventionally, two thermocouple wires are contained in a single thermocouple sheath and separated by potting material. In such a case, wire management can be challenging. In embodiments disclosed herein, the two thermocouple wires (conductors 202, 204) are isolated from each other and they are connected directly to the individual terminations. In this manner, each conductor is supported from the sheath 208 to the terminations 304, 306 without the need for a separate potted transition.

In general, an insulator 308 surrounds the terminations 304, 306 and insulates them from the flange 302.

Figure 3B:
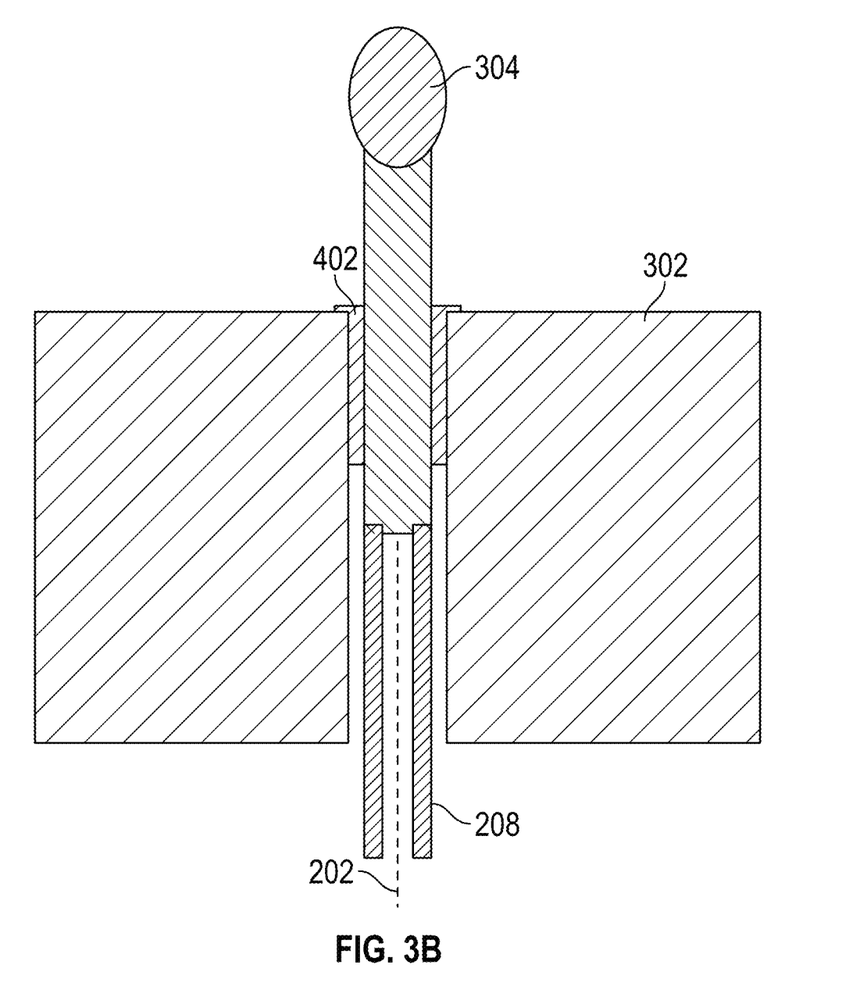
FIG. 3B is a simplified cross-section of the assembly of 3A in the region where a termination passes through the mounting flange.

FIG. 3B is a simplified sectional view of a region where the terminations (e.g, in this case, termination 304) passes through the flange 302. A glass seal 402 is provided between the termination 304 and the flange 302. For simplicity, the insulator 308 of FIG. 3A is omitted from FIG. 3B. The conductor 202 is electrically coupled to the termination 204. As illustrated, the sheath 208 is connected directly to the termination 304 to provide the support as described above.

In some prior art applications, connection to the terminations is by using terminal studs which are torque tightened with the connection which could result in breakage of the terminals. Herein, the connections shown in the arrangement will address the issue with terminal type of design. Further, in one embodiment, the connections to the terminations can be contained in connection housing.

An example of a connection housing is shown by element 310 in FIG. 3. It shall be understood that the connection housing 310 can be connected over a connection assembly 312 that is the same or different than that shown in FIG. 3. Different types of connection assemblies 312 are described below. The connectors 314 of the connection assembly 312 can be spring joints or wave springs.

Figure 4:
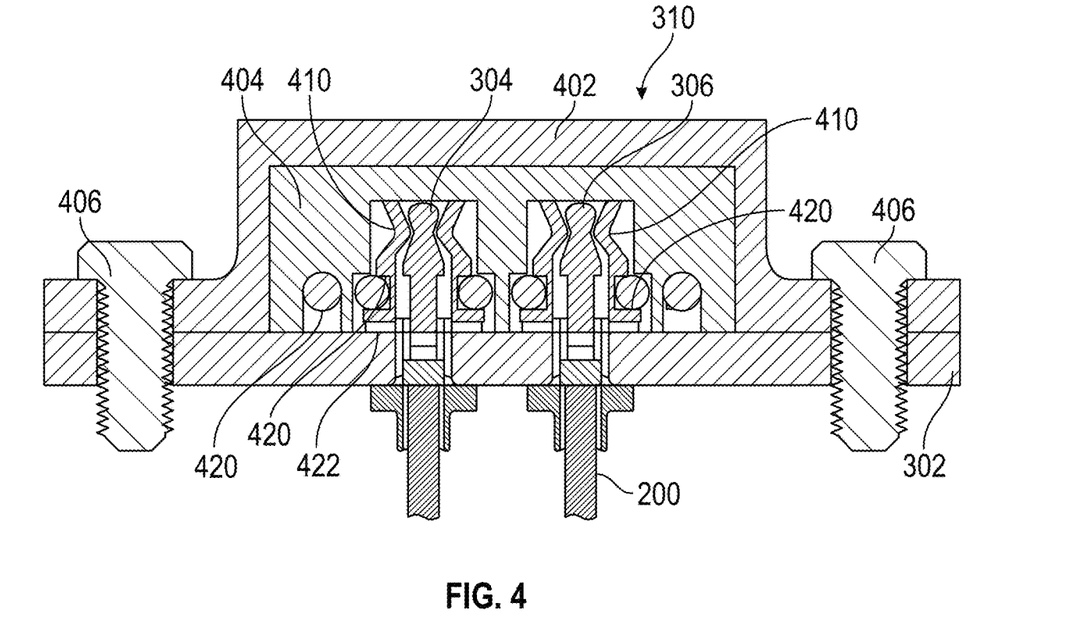
FIG. 4 is a cross-section of a housing installed over connectors according to one embodiment.

FIG. 4 shows a cross section of a connection housing 310 connected to the mounting flange 302 by fasteners 406 which can be bolts in one embodiment.

With reference to FIGS. 3 and 4, the housing 310 is used to secure the connection assembly 312 to the terminations 304, 306. The housing 310 includes an outer metal portion 402 that surrounds an insert molded inner region 404. The insert molded inner region 404 can be formed of a glass-mica composite material in one embodiment. The insert molded inner region 404 can be selected such that it has one or more of the following attributes: Dielectric strength properties to support insulation of 19 KV/mm, a working temperature-Up to 600° C., can be molded with metal, has a high structural rigidity (e.g., Young's Modulus-80 Gpa and Flexural strength-90 Mpa) and that is non-reactive to general aircraft working environment (Eg: De-icing fluids etc.)

The insert molded inner region 404 can be sized and arranged to receive the illustrated spring loaded joints 410. As illustrated the spring loaded joints 410 are isolated from the flange by insulator 422.

As illustrated, the spring loaded joints 410 are circled by wires 420 but this is not required.

Figure 5:
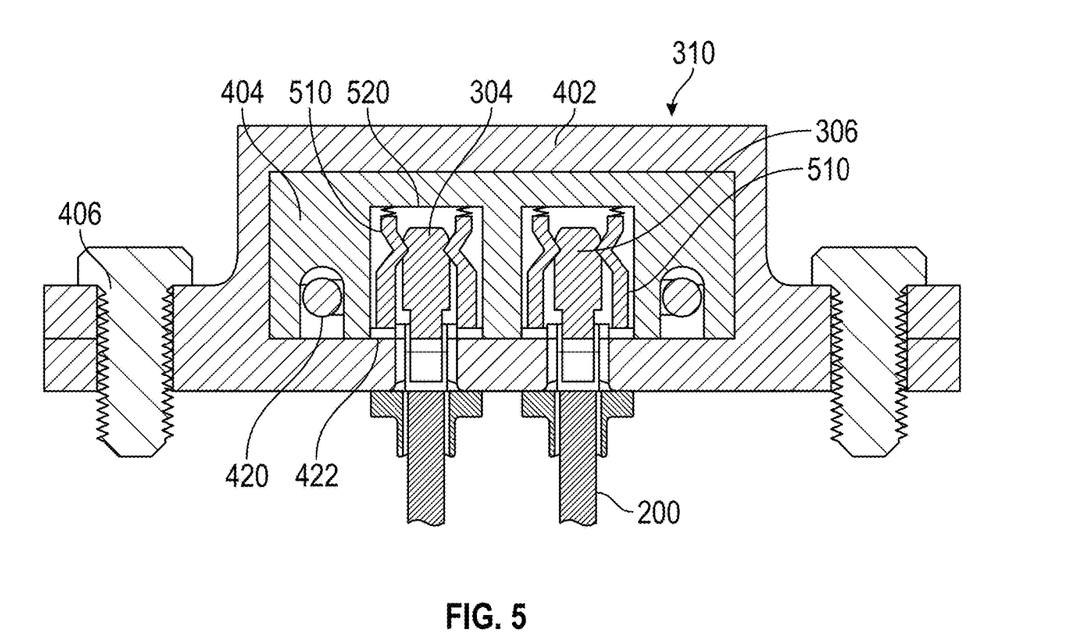
FIG. 5 is a cross-section of a housing installed over connectors according to one embodiment.

FIG. 5 shows a different cross section of a connection housing 310 connected to the mounting flange 302 by fasteners 406 which can be bolts in one embodiment.

Like before, the housing 310 is used to secure the connection assembly 312 to the terminations 304, 306. The housing 310 includes an outer metal portion 402 that surrounds an insert molded inner region 404. The insert molded inner region 404 can be formed of a glass-mica composite material in one embodiment. The insert molded inner region 404 can be selected in the manner as described above.

The insert molded inner region 404 can be sized and arranged to receive the illustrated joints 510. As illustrated the joints are isolated from the flange by insulator 422.

As illustrated, the joints 510 are circled by wires 420 but this is not required. In the embodiment, wave springs 520 can be used to ensure electrical connection between the joints 510 are the terminations 304, 304.

Figure 6A:
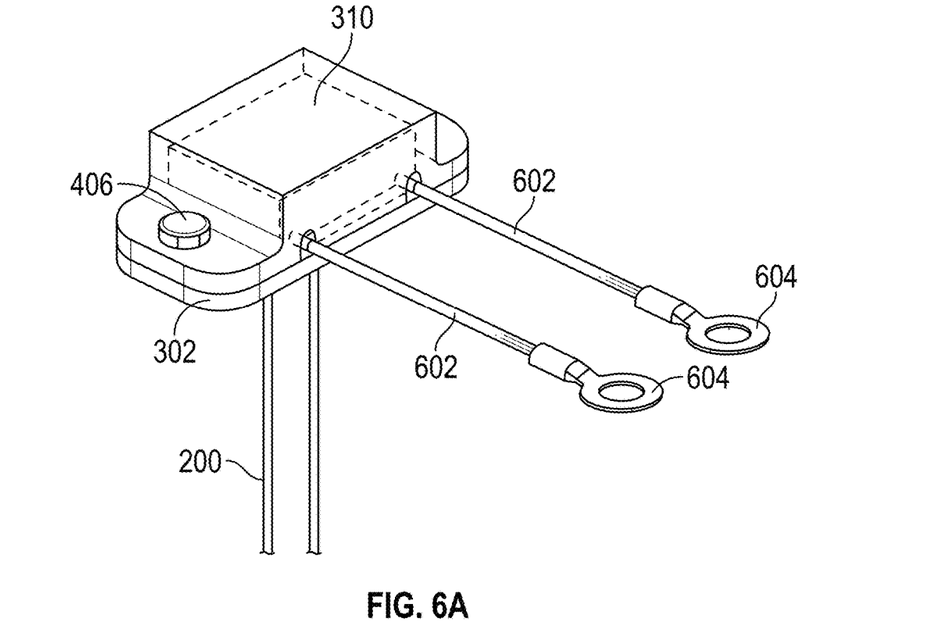
FIG. 6A is an assembled view of a thermocouple assembly according to one embodiment that includes a thermocouple, connectors having ring terminals on one or both end and a housing that connects to a mounting flange of that covers the connectors.
Figure 6B:
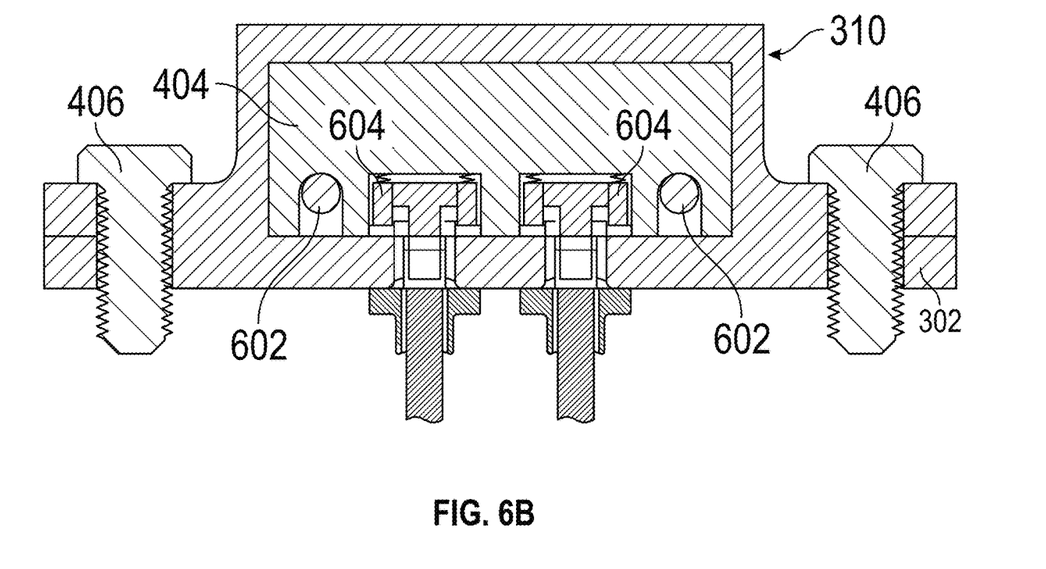
FIG. 6B is a cross-section of a housing installed over connectors according to one embodiment.

In yet another embodiment, rather than using spring loaded joints or a combination of a joint and a wave spring, the connection could be made by ring terminals. For example, and with reference to FIGS. 6A and 6B, the connectors 602 can include ring terminals 604 on one or both ends. The housing 310 is, again, connected to the flange 302 by connectors 406 and includes an insert molded inner region 404 sized and arranged to receive the ring terminal 604.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A thermocouple assembly for use in a high-temperature gas path, the assembly comprising:
    a thermocouple that includes:
        a first conductor having a first axis and a second conductor having a second axis, the first and second conductors formed of different materials and coupled to one another by a junction;
        a metal sheath surrounding the first and second conductors wherein the metal sheath is substantially coaxial with the both the first conductor and the second conductor;
    a first termination electrically coupled to the first conductor;
    a second termination electrically coupled to the second conductor;
    a first connector configured to couple to the first termination;
    a second connector configured to couple to the second termination;
    a housing configured to cover the first and second terminations and the first and second connectors; and a mounting flange to which the housing is fastened and through which the first and second terminations extend along the first and second axes into the first and second connectors, respectively.

2. The thermocouple assembly of claim 1, wherein the mounting flange surrounds the first and second terminations.

3. The thermocouple assembly of claim 2, further comprising an insulator disposed between the first connector and the mounting flange.

4. The thermocouple assembly of claim 2, further comprising one or more bolts coupling the housing to the mounting flange.

5. The thermocouple assembly of claim 2, wherein the mounting flange is electrically insulated from the first termination by a glass seal.

6. The thermocouple assembly of claim 1, wherein the thermocouple further includes insulation disposed between the first conductor and the metal sheath.

7. The thermocouple assembly of claim 6, wherein the insulation is formed of MgO or $Al_2O_3$.

8. The thermocouple assembly of claim 1, wherein the metal sheath is coaxial with at least one of the first and second conductors.

9. The thermocouple assembly of claim 1, wherein the metal sheath is formed of one or more metallic alloy.

10. The thermocouple assembly of claim 9, wherein the metal sheath includes an inner layer formed of a different material than the metal sheath.

11. The thermocouple assembly of claim 1, wherein the first and second terminations are coupled to the metal sheath.

12. The thermocouple assembly of claim 1, wherein the first and second connectors are spring loaded joints.

13. The thermocouple assembly of claim 1, wherein the housing includes an outer metal portion and an insert molded inner region within the outer metal portion.

14. The thermocouple assembly of claim 13, wherein the insert molded inner region is formed of a glass-mica composite material.

15. The thermocouple assembly of claim 13, further including wave springs disposed in the insert molded inner region to hold the connections on to the terminations.

16. The thermocouple assembly of claim 1, further including a first wire encircling the first connector and a second wire encircling the second connector.

17. The thermocouple assembly of claim 1, wherein the first and second connectors are ring connectors.

18. A thermocouple assembly, comprising:
a thermocouple including first and second conductors having first and second axes, respectively, the first and second conductors being formed of different materials and coupled to one another by a junction, and a metal sheath surrounding and substantially coaxial with the first and second conductors;
first and second terminations electrically coupled to the first and second conductors, respectively;
first and second connectors configured to couple to the first and second terminations, respectively;
a housing configured to cover the first and second terminations and the first and second connectors; and
a mounting flange to which the housing is fastened and through which the first and second terminations extend along the first and second axes into the first and second connectors, respectively.

* * * * *